(12) United States Patent
Bradford et al.

(10) Patent No.: US 8,785,113 B2
(45) Date of Patent: Jul. 22, 2014

(54) METHOD AND MATERIALS FOR REVERSE PATTERNING

(75) Inventors: Michael L. Bradford, Midland, MI (US); Eric Scott Moyer, Midland, MI (US); Sheng Wang, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 45 days.

(21) Appl. No.: 13/386,502

(22) PCT Filed: Jun. 22, 2010

(86) PCT No.: PCT/US2010/039408
§ 371 (c)(1),
(2), (4) Date: Jan. 23, 2012

(87) PCT Pub. No.: WO2011/011139
PCT Pub. Date: Jan. 27, 2011

(65) Prior Publication Data
US 2012/0122037 A1 May 17, 2012

Related U.S. Application Data

(60) Provisional application No. 61/227,915, filed on Jul. 23, 2009.

(51) Int. Cl.
*G03F 7/26* (2006.01)

(52) U.S. Cl.
USPC .......................................................... 430/322

(58) Field of Classification Search
CPC .............. G03F 7/405; H01L 21/02126; H01L 21/02216; H01L 21/0337; H01L 21/3122
USPC .................. 430/322, 323, 324, 325
See application file for complete search history.

(56) References Cited

U.S. PATENT DOCUMENTS

| | | | |
|---|---|---|---|
| 6,383,952 B1 | 5/2002 | Subramanian et al. | |
| 2008/0067550 A1 | 3/2008 | Lee et al. | |
| 2008/0124931 A1 | 5/2008 | Lee et al. | |
| 2008/0199814 A1 | 8/2008 | Brzozowy et al. | |
| 2008/0299494 A1 | 12/2008 | Bencher et al. | |
| 2010/0040838 A1* | 2/2010 | Abdallah et al. ............ | 428/195.1 |

FOREIGN PATENT DOCUMENTS

| | | | |
|---|---|---|---|
| EP | 1769018 | | 11/2007 |
| JP | 1992028722 | | 1/1992 |
| JP | 2001027799 | | 1/2001 |
| WO | WO-2005-063890 | * | 7/2005 |

* cited by examiner

*Primary Examiner* — Brittany Raymond
(74) *Attorney, Agent, or Firm* — Dow Corning Corporation; Sharon K. Brady; Claude F. Purchase

(57) ABSTRACT

A silsesquioxane resin is applied on top of the patterned photo-resist and cured to produce a cured silsesquioxane resin on top of the pattern surface. Subsequently, a reactive ion etch recipe containing $CF_4$ to "etch back" the silicon resin to the top of the photoresist material, exposing the entire top surface of the organic based photoresist. Then, a second reactive ion etch recipe containing $O_2$ to etch away the organic photoresist. The result is a silicon resin film with via holes with the size and shape of the post that were patterned into the photoresist. Optionally, the new pattern can be transferred into the underlying layer(s).

16 Claims, 1 Drawing Sheet

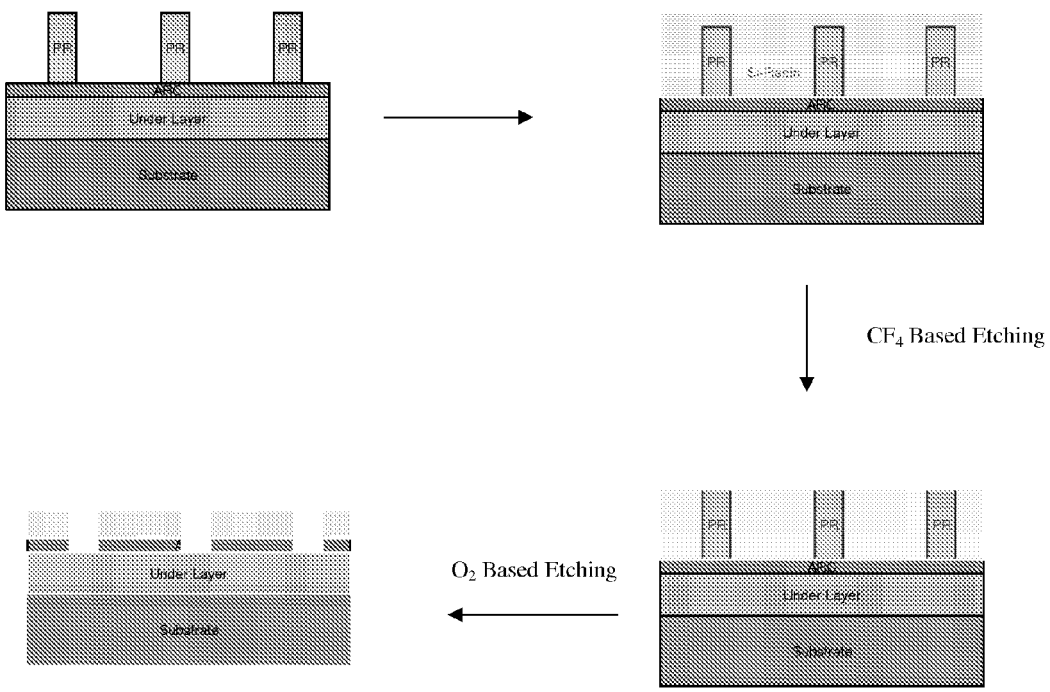

METHOD AND MATERIALS FOR REVERSE PATTERNING

CROSS REFERENCE TO RELATED APPLICATIONS

This application is a U.S. national stage filing under 35 U.S.C. §371 of PCT Application No. PCT/US10/39408 filed on Jun. 22, 2010, currently pending, which claims the benefit of U.S. Provisional Patent Application No. 61/227,915 filed Filing date Jul. 23, 2009 under 35 U.S.C. §119 (e). PCT Application No. PCT/US10/39408 and U.S. Provisional Patent Application No. 61/227,915 are hereby incorporated by reference.

BACKGROUND OF THE INVENTION

In the microelectronics industry, the requirements for increased circuitry for a given chip size has driven to smaller half-pitch nodes in order to increase the process speed and improve the chip efficiency. Microlithography techniques are key to reducing the size of structural features. The depth of focus and resolution depend on the numerical aperture of the lithography apparatus and the wavelength of light.

As feature sizes continue to decrease in size, it is particularly difficult to pattern round via holes or contact holes into photo-resists. As features get smaller and approach 50 nm and beyond in diameter this task becomes extremely difficult to achieve a smooth round shaped via hole of the appropriate dimension in relatively thick film of photoresist. Therefore, alternative approaches to forming via or contact holes in a more etch resistant film are desired.

In this invention a "reverse" patterning technique is employed. The reverse pattern technique involves using a photoresist to pattern posts into the photoresist instead of via holes. After the appropriate dimension of the post is patterned using a photoresist, a silicon containing material is coated on top of the patterned post to cover the entire pattern. For application, this silicon resin is carried in a solvent that the photoresist is not soluble in. After coating, the silicon containing film will be subjected to a low temperature prebake to drive off solvent and slightly crosslink the resin. In some cases further cure is required and can be performed with some activator under thermal or UV treatment. In order to transfer the reverse pattern of the photoresist into the silicon containing resin, two dry etching techniques are employed. The first etch step is to use a reactive ion etch recipe containing $CF_4$ to "etch back" the silicon resin to the top of the photoresist material, exposing the entire top surface of the photoresist. The second etch step is to use a second reactive ion etch recipe containing $O_2$ to etch away the photoresist. The result is a silicon resin film with via holes with the size and shape of the posts that were patterned into the photoresist. The resulting film can be used to further transfer the via hole pattern onto another critical layer. Since it is much easier to pattern post in a photoresist than via holes, this process provides a way to pattern a more etch resistant silicon containing resin than alternative approaches. In this document this approach is referred to as "reverse patterning."

In order for a silicon containing material to be useful in reverse patterning, it must meet several criteria. First, it must be carried in a solvent such as an organic alcohol or ether that the photoresist is not soluble in. Additionally, it must be capable of being cured by multiple cure methods to allow for the formation of select compositions that can be etched by different etch methods such as $CF_4$ and $O_2$. It has been found that certain silsesquioxane resins meet these criteria.

BRIEF SUMMARY OF THE INVENTION

This invention pertains to the use of silsesquioxane resin compositions in producing patterns on a substrate, typically an electronic device. In this process one starts with a substrate having a patterned photo-resist layer thereon. The silsesquioxane resin is applied over the patterned photo-resist and cured at the pattern surface to produce a cured silsesquioxane resin on the pattern surface. After coating, the silicon containing film will be subjected to a low temperature prebake to drive off solvent. In order to transfer the reverse pattern of the photoresist into the silicon containing resin, two dry etching techniques are employed. The first etch step is to use a reactive ion etch recipe containing $CF_4$ to "etch back" the silicon resin to the top of the photoresist material, exposing the entire top surface of the photoresist. The second step is to use a second reactive ion etch recipe containing $O_2$ to etch away the photoresist leaving the silsesquioxane resin. The result is a silicon resin film with via holes the size and shape of the post that were patterned into the photoresist. The resulting film can be used to further transfer the via hole pattern onto another critical layer.

BRIEF DESCRIPTION OF THE DRAWINGS

FIG. 1 represents the process steps of forming a pattern on a substrate using a silsesquioxane resin using a method of reverse patterning.

DETAILED DESCRIPTION OF THE INVENTION

This invention pertains to forming a pattern on a substrate wherein the method comprises (I) applying a coating composition over a first patterned material wherein the coating composition comprises (i) a silsesquioxane resin comprised of the units

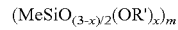

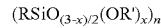

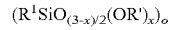

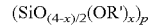

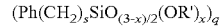

where Ph is a phenyl group, Me is a methyl group; R' is hydrogen atom or a hydrocarbon group having from 1 to 4 carbon atoms; R is a reactive organic group selected from groups containing epoxy functionality such as 3-glycidoxypropyl group or 2-(3,4-epoxycyclohexyl)-ethyl- group and groups containing acryloxy functionality such as methacryloxypropyl group, acryloxypropyl group, and $R^1$ is a hydrophilic group; and s has a value of 0, 1, 2, 3, or 4; x has a value of 0, 1 or 2; wherein in the resin m has a value of 0.2 to 0.95, n has a value of 0.01 to 0.5; o has a value of 0 to 0.20; p has a value of 0 to 0.75; q has a value of 0 to 0.5 and m+n+o+p≈1; and (ii) a solvent for carrying the resin such as an alcohol or an ether;

(iii) an activator such as a thermal acid generator, a photo acid generator, an amine crosslinker, a thermal free radical initiator, or a photo free radical initiator (or photoinitiator)

(III) curing the coating composition to produce a cured silicon coating on top of the first patterned material covering the entire pattern
(IV) partially removing the cured silicon coating to expose the top surface of the first patterned material;
(V) removing the first patterned material thereby forming a second patterned in the cured silicon coating; and
(VI) optionally, further transferring the second pattern onto any underlayer.

The silsesquioxane resins are comprised of the units $(MeSiO_{(3-x)/2}(OR')_x)_m$ $(RSiO_{(3-x)/2}(OR')_x)_n$ $(R^1SiO_{(3-x)/2}(OR')_x)_o$ $(SiO_{(4-x)/2}(OR')_x)_p$ $(Ph(CH_2)_sSiO_{(3-x)/2}(OR')_x)_q$ where Ph is a phenyl group, Me is a methyl group; R' is hydrogen atom or a hydrocarbon group having from 1 to 4 carbon atoms; R is a reactive organic group selected from groups containing epoxy functionality such as 3-glycidoxypropyl group or 2-(3,4-epoxycyclohexyl)-ethyl- group and groups containing acryloxy functionality such as methacryloxypropyl group, acryloxypropyl group, and $R^1$ is a hydrophilic group; and s has a value of 0, 1, 2, 3, or 4; x has a value of 0, 1 or 2; wherein in the resin m has a value of 0.20 to 0.95, n has a value of 0.01 to 0.50; o has a value of 0 to 0.20; p has a value of 0 to 0.75; q has a value of 0 to 0.5 and m+n+o+p+q≈1. Typically m has a value of 0.2 to 0.95, alternatively 0.5 to 0.90. Typically n has a value of 0.01 to 0.50, alternatively 0.05 to 0.30. Typically o has a value of 0 to 0.50, alternatively 0 to 0.20. Typically p has a value of 0 to 0.75, alternatively 0 to 0.30. Typically q has a value of 0 to 0.5, alternatively 0 to 0.15, alternatively 0 to 0.10.

R' is independently a hydrogen atom or hydrocarbon group having 1 to 4 carbon atoms. R' may be exemplified by H, methyl, ethyl, propyl, iso-propyl, n-butyl, and tert-butyl. Typically R' is H or methyl.

R is a reactive organic group. Reactive organic groups may be exemplified by, but not limited to a group containing epoxy functionality, a group containing acryloxy functionality. Groups containing epoxy functionality may be represented by the formula —$R^2OCH_2CH(O)CH_2$, where $R^2$ is hydrocarbon group having 1 to 4 carbon atoms or a polyether group or —$CH_2CH_2$—($C_6H_9(O)$). Groups containing epoxy functionality may be exemplified by 3-glycidoxypropyl group or 2-(3,4-epoxycyclohexyl) group. Groups containing acryloxy functionality represented by the formula $CH_2$=C($R^3$)COO$R^4$—, where $R^3$ is hydrogen atom or a methyl group and $R^4$ is hydrocarbon group having 1 to 4 carbon atoms or a polyether group. Groups containing acryloxy functionality may be exemplified by, but not limited to, methacryloxypropyl or acryloxypropy.

$R^1$ is a hydrophilic group. Hydrophilic groups may be exemplified by, but not limited to, substituted phenyl groups, ester groups, polyether groups, and mercapto groups. Substituted phenyl groups contain at least one HO—, MeO—, Me-, Et-, Cl—, and/or other substituents. Ester groups may be any organic substituent containing at least one ester functionality. Examples of ester groups useful herein are —$(CH_2)_2$—O—C(O)Me and —$(CH_2)_2$—C(O)—OMe. Polyether groups are an organic substituent having hydrocarbon units linked through oxygen atom, represented, but not limited, by the following structure: —$(CH_2)_a[O(CH_2CH_2)_b]_cOR'$, or —$(CH_2)_a[O(CH_2CH(CH_3))_b]_cOR'$, wherein a=2 to 12; b=1 to 6; c=2 to 200; R'=H, —C(O)CH$_3$, alkyl, or other organic groups. Examples of polyether groups useful herein are —$(CH_2)_3$—$(OCH_2CH_2)_c$—OMe, —$(CH_2)_3$—$(OCH_2CH_2)_c$—OH and —$(CH_2)_3$—$(OCH_2CH_2)_7$—OAc and —$(CH_2)_3$—$(OCH_2CH_2)_c$—OC(O)Me, and —$(CH_2)_3[O(CH_2CH(CH_3))]_cOH$, —$(CH_2)_3[O(CH_2CH(CH_3))]_cOCH_3$. Mercapto groups have the general formula HS$(CH_2)_r$— where s is as described above. Examples of mercapto groups are mercaptopropyl, mercaptoethyl, and mercaptomethyl.

Examples of resins useful herein may be exemplified by, but not limited to:

$(MeSiO_{(3-x)/2}(OR')_x)_{0.80}(RSiO_{(3-x)/2}(OR')_x)_{0.20}$, R=—$CH_2CH_2CH_2O$—$CH_2CH(O)CH_2$ $(MeSiO_{(3-x)/2}(OR')_x)_{0.90}(RSiO_{(3-x)/2}(OR')_x)_{0.10}$ R=—$CH_2CH_2CH_2O$—$CH_2CH(O)CH_2$ $(MeSiO_{(3-x)/2}(OR')_x)_{0.80}(RSiO_{(3-x)/2}(OR')_x)_{0.20}$ R=—$CH_2CH_2C_6H_9(O)$ $(MeSiO_{(3-x)/2}(OR')_x)_{0.60}(RSiO_{(3-x)/2}(OR')_x)_{0.20}(SiO_{(4-x)/2}(OR')_x)_{0.20}$ R=—$CH_2CH_2CH_2O$—$CH_2CH(O)CH_2$ $(MeSiO_{(3-x)/2}(OR')_x)_{0.775}(RSiO_{(3-x)/2}(OR')_x)_{0.20}(R^1SiO_{(3-x)/2}(OR')_{0.025}$ R=—$CH_2CH_2CH_2O$—$CH_2CH(O)CH_2$, $R^1$=—$CH_2CH_2CH_2O$—$(CH_2CH_2O)_gR''$ with g<100 and R'' can be any organic group with 1-8 carbons.

$(MeSiO_{(3-x)/2}(OR')_x)_{0.80}(RSiO_{(3-x)/2}(OR')_x)_{0.20}$ R=—$CH_2CH_2CH_2O$—CO—C(CH$_3$)=CH$_2$ $(MeSiO_{(3-x)/2}(OR')_x)_{0.70}(RSiO_{(3-x)/2}(OR')_x)_{0.30}$ R=—$CH_2CH_2CH_2O$—CO—C(CH$_3$)=CH$_2$ $(MeSiO_{(3-x)/2}(OR')_x)_{0.725}(RSiO_{(3-x)/2}(OR')_x)_{0.20}(PhSiO_{(3-x)/2}(OR')_x)_{0.075}$ R=—$CH_2CH_2CH_2O$—CO—C(CH$_3$)=CH$_2$ $(MeSiO_{(3-x)/2}(OR')_x)_{0.95}(RSiO_{(3-x)/2}(OR')_x)_{0.05}$ R=—$CH_2CH_2CH_2O$—CO—C(CH$_3$)=CH$_2$ $(MeSiO_{(3-x)/2}(OR')_x)_{0.80}(RSiO_{(3-x)/2}(OR')_x)_{0.20}$ R=—$CH_2CH_2CH_2O$—CO—C(CH$_3$)=CH$_2$ $(MeSiO_{(3-x)/2}(OR')_x)_{0.60}(RSiO_{(3-x)/2}(OR')_x)_{0.20}(SiO_{(4-x)/2}(OR')_x)_{0.20}$ R=—$CH_2CH_2CH_2O$—CO—C(CH$_3$)=CH wherein in the above resins R' is Me or H.

The typical method for producing the silsesquioxane resin involves the hydrolysis and/or condensation of the appropriate silanes. By this method it is possible that residual —OH and/or —OR' will remain in the silsesquioxane resin as a result of incomplete hydrolysis or condensation. If the total amount of units in the silsesquioxane resin containing —OR' groups, exceed 70 mole % then gellation and instability of the resin may occur. Typically the silsesquioxane resin contains 6 to 60 mole % of units containing —OR' groups, depending upon the synthetic routes.

The silsesquioxane resin has a weight average molecular weight (Mw) in the range of 500 to 200,000, alternatively in the range of 500 to 100,000, alternatively in the range of 700 to 30,0000 as determined by gel permeation chromatography employing RI detection and polystyrene standards.

The silsesquioxane resin is typically produced in the presence of a solvent. Any suitable organic or silicone solvent that does not contain a functional group other than alcohol which may participate in the hydrolysis and/or condensation reaction may be used in producing the silsesquioxane resin. The solvent is generally used in an amount of 40 to 98 weight percent based on the total weight of solvent and silane reactants, alternatively 70 to 90 weight percent. The reaction may be carried out as a dual phase or single-phase system.

Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol diethyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as propylene glycol monomethyl ether acetate (PGMEA), isobutyl isobutyrate and propyl propionate; alcohols such as methanol, ethanol, and isopropanol. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silsesquioxane resin can be carried out at any temperature so long as it does not cause significant gellation or cause curing of the silsesquioxane resin. Typically the reaction is carried out at a temperature in the range of 5° C. to 150° C., with 15° C. to 110° C. suggested.

The time to form the silsesquioxane resin is dependent upon a number of factors such as the temperature, the type and amount of silane reactants, and the amount of catalyst. Typically the reaction time is from several minutes to several hours. One skilled in the art will be able to readily determine the time necessary to complete the reaction. Acid catalysts that may be used to facilitate the reaction include, but are not limited to, nitric acid, sulfuric acid, sulfonic acid, hydrochloric acid, acetic acid, and others. Base catalysts that may be used to facilitate the reaction include, but are not limited to, sodium hydroxide, potassium hydroxide, cesium hydroxide, tetramethylammonium hydroxide, tetrabutyl ammonium hydroxide, triethylamine, among others.

Following completion of the reaction the catalyst may be optionally removed. Methods for removing the catalyst are well known in the art and would include neutralization, stripping or water washing or combinations thereof. Large amounts of catalyst may negatively impact the shelf life of the silicone resin especially when in solution thus its removal is suggested.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silsesquioxane resin a number of optional steps may be carried out to obtain the silsesquioxane resin in the desired form or desired concentration. For example, the silsesquioxane resin may be concentrated by removing the solvent. The method of solvent removal is not critical and numerous methods are well known in the art (e.g. distillation under heat and/or vacuum). Once the concentration of the silsesquioxane resin reaches to a certain concentration, the resin can be diluted with the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

The coating composition typically contains a solvent. The solvent should be one that does not dissolve the patterned coating. Useful solvents include, but are not limited to, 1-methoxy-2-propanol, 4-methyl-2-pentanol, propylene glycol monomethyl ethyl acetate, γ-butyrolactone, and cyclohexanone, among others. The coating composition typically comprises from 10% to 99.9 wt % solvent based on the total weight of the coating composition, alternatively 80 to 98 wt %.

The coating composition is applied on a substrate having a pattern thereon. Typically the substrate is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

The pattern on the semiconductor device is typically a photoresist layer that has been applied and patterned. Typically the patterned photoresist is formed over an antireflective coating which is formed over a hardmask as seen in FIG. 1. Methods for applying the photoresist, antireflective coating and hardmask layers are known in the art. Methods for producing a pattern in the photoresist layer are also known in the art.

The coating composition typically comprises an activator, depending upon the reactive functional groups. In the case wherein the silsesquioxane resin comprises epoxy functional groups, the activator is selected from a thermal acid generator, photoacid generator or an amine crosslinker. In the case wherein the silsesquioxane resin comprises acrylate or methacrylate functional groups, the activator is selected from a free radical thermal initiator or a photo radical initiator.

A thermal acid generator is a compound which is capable of generating an acidic moiety when heated, e.g., during the baking step or the resist flow process. Thermal acid generators can be nonionic thermal acid generator, ionic acid generator or polymeric acid generators. Exemplary nonionic thermal acid generators include but no limit to cyclohexyl p-toluenesulfonate, menthyl p-toluenesulfonate and cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, the alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and mixtures thereof. Ionic thermal acid generators include but not limit to dodecylbenzenesulfonic acid triethylamine salt, dodecylbenzenedisulfonic acid triethylamine salt, sulfonate salts, such as carbocyclic aryl (e.g. phenyl, napthyl, anthracenyl, etc.), heteroaryl (e.g. thienyl) or aliphatic sulfonate salts, preferably carbocyclic aryl sulfonate salts, optionally substituted benzenesulfonate salts, etc. The carbocyclic aryl sulfonate salts can be unsubstituted or substituted by, for example, one or more of hydroxy; optionally substituted alkyl; optionally substituted alkenyl; optionally substituted alkoxy; optionally substituted carbocyclic aryl e.g. optionally substituted phenyl, optionally substituted naphthyl, optionally substituted anthracene and the like; optionally substituted aralkyl such as aralkyl e.g. optionally substituted benzyl and the like; and optionally substituted heteroaromatic or heteroalicyclic groups preferably having 1 to 3 rings, 3 to 8 ring members in each ring and from 1 to 3 heteroatoms such as coumarinyl, quinolinyl, pyridyl, pyrazinyl, pyrimidyl, furyl, pyrrolyl, thienyl, thiazolyl, oxazolyl, imidazolyl, indolyl, benzofuranyl, benzothiazol, tetrahydrofuranyl, tetrahydropyranyl, piperdinyl, morpholino, pyrrolindinyl; and others.

A photo acid generator is a compound which is capable of generating an acidic moiety when exposed to UV, e.g., during the baking step or the resist flow process. Photo acid generators include sulfide and onium type compounds. Photo acid generators include, but are not limited to diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate.

An amine crosslinker is a compound which is capable of generating amine when heated or exposed to UV, e.g., during the baking step or the resist flow process. Exemplary amine crosslinkers include but not limited to glycoluril-formaldehyde resins, melamine-formaldehyde resins, benzoguanamine-formaldehyde resins, and urea-formaldehyde resins, N,N,N,N-tetra(alkoxymethyl)glycoluril, N,N,N,N-tetra(alkoxymethyl)glycoluril, N,N,N,N-tetra(methoxymethyl)glycoluril, N,N,N,N-tetra(ethoxymethyl)glycoluril, N,N,N,N-tetra(n-propoxymethyl)glycoluril, N,N,N,N-tetra(t-propoxymethyl)glycoluril, N,N,N,N-tetra(n-butoxymethyl)glycoluril and N,N,N,N-tetra(t-butoxymethyl)glycoluril. N,N,N,N-tetra(methoxymethyl)glycoluril is available under the trademark POWDERLINK from Cytec Industries (e.g., POWDERLINK 1174).

A free radical thermal initiator is a compound which is capable of generating a free radical when heated during baking step. Suitable free radical thermal initiators include, but not limited to benzoyl peroxide, dicumyl peroxide, azobisisobutyronitrile (AIBN), among others. The thermal initiator added to the solution can be a single initiator or two or more of the mixture of the thermal initiators.

A free radical photo initiator is a compound which is capable of generating a free radical hen exposed to UV during the bake step. Suitable photo initiators include, but not limited to 2,4,6-trimethylbenzoyldiphenyl phosphine oxide, di-(2,4,6-trimethylbenoylphenyl phosphine oxide, benzoin derivatives, methylolbenzoin derivative, 4-benzyl-1,3-dioxolane derivatives, benzilketals, 1-hydroxycyclohexy phenylketone, 2-methyl-1-[4-(methylthio)phenyl]-2-morpholino-propan-2-one, 2-benzyl-2-dimethylamino-1-(4-morpholinophenyl)-butan-1-one, α,α-dialkoxyacetophenones, phenylglyoxylates.

Typically the activator is present in the coating composition in an amount of up to 20,000 ppm, alternatively 10 to 10,000 ppm, based on the total weight of the coating composition.

Optionally a stabilizer is incorporated in the coating composition in the case of silsesquioxane with acrylate or methacrylate functional groups in an amount of up to 50,000 ppm, alternatively 10 to 10,000 ppm, based on the total weight of the coating composition. A stabilizer is a compound which is capable of scavenging a free radical during the storage of the coating composition. Stabilizers include but not limit to 2,6-bis(1,1-dimethylethyl)-4-methylphenol (BHT), hydroquinone, etc.

Specific methods for application of the coating composition to the substrate include, but are not limited to, spin-coating, dip-coating, spay-coating, flow-coating, screen-printing and others. The typical method for application is spin coating. Typically, coating involves spinning the electronic device, at 1,000 to 2,000 RPM, and adding the coating composition to the surface of the spinning electronic device.

Once the coating composition has been applied, any solvent is removed and the coating composition exposed to a curing mechanism to activate the activator in the reverse patterning coating layer and cause the coating composition to cure. Depending on the functional group on the silsesquioxane resin and the activator in the composition the curing mechanism may be by thermal or radiation.

To thermally cure the coating composition, the coated substrate is heated to a sufficient temperature for a sufficient duration to lead to curing. Curing may take place for example by heating the coated electronic device at 80° C. to 450° C. for 0.1 to 60 minutes, alternatively 150° C. to 275° C. for of 0.5 to 5 minutes, alternatively 200° C. to 250° C. for 0.5 to 2 minutes. Any method of heating may be used during the curing step. For example, the coated electronic device may be placed in a quartz tube furnace, convection oven or allowed to stand on hot plates.

Radiation curing occurs when the coating composition is exposed to a radiation source such as UV, X-ray, e-beam, EUV, or the like. Typically ultraviolet radiation having a wavelength of 193 nm to 365 nm is used, alternatively ultraviolet radiation having a wavelength of 246 nm or 365 nm is used. Suitable radiation sources include mercury, mercury/xenon, and xenon lamps. At longer wavelength radiation is used, e.g., 365 nm, it is suggested to add a sensitizer to the coating composition to enhance absorption of the radiation. Full exposure of the coating composition is typically achieved with less than 100 mJ/cm$^2$ of radiation, alternatively with less than 50 mJ/cm$^2$ of radiation.

The amount of coating composition that cures will depend upon the amount of activator in the photo-resist and the time that the coating composition is exposed to the curing mechanism. When the coating composition is exposed to a radiation source, it may be desirable to carry out a subsequent thermal treatment to promote the cure in the resin.

In order to transfer the reverse pattern of the first patterned material, typically a photoresist, into the cured silicon coating, two dry etching techniques are employed. The first etch step is to use a reactive ion etch recipe containing $CF_4$ to "etch back" the cured silicon coating to the top of the first patterned material, exposing the entire top surface of the first patterned material.

The second step is to use a second reactive ion etch recipe containing $O_2$ to etch away the first patterned material. The result is a cured silicon coating with via holes the size and shape of the first patterned material. The cured silicon coating can be used to further transfer the via hole pattern onto another critical layer.

Additional steps or transferring the pattern into the underlying layers may be employed to produce a device having the desired architecture.

EXAMPLES

The following examples are included to demonstrate embodiments of the invention. It should be appreciated by those of skill in the art that the techniques disclosed in the examples which follow represent techniques discovered by the inventor to function well in the practice of the invention, and thus can be considered to constitute typical modes for its practice. However, those of skill in the art should, in light of the present disclosure, appreciate that many changes can be made in the specific embodiments which are disclosed and still obtain a like or similar result without departing from the invention. All percentages are in wt. %.

Example 1

$T^{Me}_{0.80}T^{R}_{0.20}$, R=—CH$_2$CH$_2$CH$_2$O—CH$_2$CH(O)CH$_2$

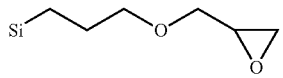

150 g of toluene, 109.0 g of methyltrimethoxysilane (0.80 mol), 47.3 g of (3-glycidoxypropyltrimethoxysilane (0.20 mol), 294 g of methanol, 72 g of water, 0.46 g of tetramethylammonium hydroxide in methanol at 10 wt % were combined in a flask. The mixture was stirred for 1 hour at room temperature and then refluxed for 3 hours. Then, 1 g of 0.1 N nitric acid was added. The solution was stirred for 5 min. Then 6 g of acetic acid was added. After about 5 min., the solvent was removed through a Dean-Stark trap. After about 350 g of solvent was removed, the temperature was raised to 72° C. Subsequently, 150 g of toluene was added to the reactor and the solvent was continuously removed. Meanwhile, the same amount of toluene was added to keep the resin concentration constant. Once the temperature reached to 91° C., the reaction was stopped. The resin solution was washed 5 times with 250 ml of water each time. The remaining cloudy solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 5 wt % with 4-methyl-2-pentanol.

Example 2

$T^{Me}_{0.90}T^{R}_{0.10}$, R=—CH$_2$CH$_2$CH$_2$O—CH$_2$CH(O)CH$_2$ 150 g of toluene, 122.6 g of methyltrimethoxysilane (0.90 mol), 24.84 g of (3-glycidoxypropyltrimethoxysilane (0.20 mol), 294 g of methanol, 72 g of water, 0.46 g of tetramethylammonium hydroxide in methanol at 10 wt % were combined in a flask. The mixture was stirred for 1 hour at room temperature and then refluxed for 3 hours. Then, 1 g of 0.1 N nitric acid was added. The solution was stirred for 5 min. Then 6 g of acetic acid was added. After about 5 min., the solvent was removed through a Dean-Stark trap. After about 350 g of solvent was removed, the temperature was raised to 72° C. Subsequently, 150 g of toluene was added to the reactor and the solvent was continuously removed. Meanwhile, the same amount of toluene was added to keep the resin concentration constant. Once the temperature reached to 80° C., the reaction was stopped. The resin solution was washed 5 times with 250 ml of water each time. The remaining cloudy solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 5 wt % with 4-methyl-2-pentanol.

Example 3

$T^{Me}_{0.80}T^{R}_{0.20}$, R=—CH$_2$CH$_2$C$_6$H$_9$(O)

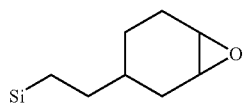

270 g of toluene, 81.75 g of methyltrimethoxysilane (0.60 mol), 24.84 g of 2-(3,4-epoxycyclohexyl)ethyl trimethoxysilane (0.15 mol), 310 g of methanol, 54 g of water, 0.150 g of cesium hydroxide in water at 50 wt % were combined in a flask. The mixture was stirred for 1 h out at room temperature and then refluxed for 2 hours. Then, 6 g of acetic acid was added. After about 5 min., the solvent was removed through a Dean-Stark trap. After about 300 g of solvent was removed, the temperature was raised to 72° C. Subsequently, 150 g of toluene was added to the reactor and the solvent was continuously removed. Meanwhile, the same amount of toluene was added to keep the resin concentration constant. Once the temperature reached to 96° C., the reaction was stopped. The resin solution was washed 5 times with 188 ml of water each time. The remaining cloudy solution was transferred to a 2 liter pear-shaped flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 5 wt % with 4-methyl-2-pentanol.

Example 4

$T^{Me}_{0.60}T^{R}_{0.20}Q_{0.20}$ R=—CH$_2$CH$_2$CH$_2$O—CH$_2$CH(O)CH$_2$ 270 g of toluene, 61.3 g of methyltrimethoxysilane, 35.5 g of (3-glycidoxypropyltrimethoxysilane), 31.2 g of tetraethylorthosilicate (TEOS), 294 g of methanol, 54 g of water, 0.345 g of tetramethylammonium hydroxide in methanol at 10 wt % were combined in a flask. The mixture was stirred for 1 hour at room temperature and then refluxed for 4 hours. Then, 6 g of acetic acid was added and the solution was stirred from 5 min. After that, the solvent was removed through a Dean-Stark trap. After about 300 g of solvent was removed, the temperature was raised to 72° C. Subsequently, 150 g of toluene was added to the reactor and the solvent was continuously removed. Meanwhile, the same amount of toluene was added to keep the resin concentration constant. Once the temperature reached to 80° C., the reaction was stopped. The resin solution was washed 5 times with 250 ml of water each time. The remaining cloudy solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 5 wt % with 4-methyl-2-pentanol.

Example 5

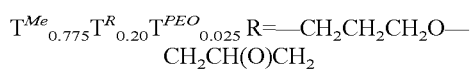
$T^{Me}_{0.775}T^{R}_{0.20}T^{PEO}_{0.025}$ R=—CH$_2$CH$_2$CH$_2$O—
CH$_2$CH(O)CH$_2$ 150 g of toluene, 79.2 g of methyltrimethoxysilane, 35.5 g of (3-glycidoxypropyltrimethoxysilane, 9.4 g of polyethyleneoxidyl trimethoxysilane, 310 g of methanol, 54 g of water, 0.345 g of tetramethylammonium hydroxide in methanol at 10 wt % were combined in a flask. The mixture was stirred for 1 hour at room temperature and then refluxed for 4 hours. Then, 6 g of acetic acid was added and the solution was stirred for 5 min. After that, the solvent was removed through a Dean-Stark trap. After about 300 g of solvent was removed, the temperature was raised to 72° C. Subsequently, 150 g of toluene was added to the reactor and the solvent was continuously removed. Meanwhile, the same amount of toluene was added to keep the resin concentration constant. Once the temperature reached to 80° C., the reaction was stopped. The resin solution was washed 5 times with 190 ml of water each time. The remaining cloudy solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 5 wt % with 4-methyl-2-pentanol.

Example 6

Formulation for Spin-Coating and UV Cure

To a bottle was added 10 g of resin solution prepared above and 0.4 mg of (p-isopropylphenyl)(p-methylphenyl)iodonium tetrakis-(pentafluorophenyl)borate. The solution was shaken vigorously until mixed well. Film coating on wafers was prepared on a Karl Suss CT62 spin coater. The formulated resin solution was first filtered through a 0.20 μm PTFE membrane filter and then spin coated onto standard single side four inch polished low resistively wafers or double sided polished FTIR wafers (spin speed 2000-4000 rpm). Films were prebaked at 140° C. for a minute and then cured via a UV source at a dosage of 10 J/cm$^2$. The film thicknesses were measured using a J. A. Woollam ellipsometer. Results are given in Table 1.

TABLE 1

Resin and Cured Thin Film Solvent Resistance

| | | | UV Cure | |
|---|---|---|---|---|
| Material | $M_w$ vs. PS | $M_w/M_n$ vs. PS | Thin Film Thickness After Cured (Å) | Thickness Change in PGMEA (Å) |
| Example 1 | 18600 | 5.68 | 1202 | 58 |
| Example 2 | 11500 | 4.10 | 1210 | 23 |
| Example 3 | 7100 | 3.15 | 1253 | 29 |

Example 7

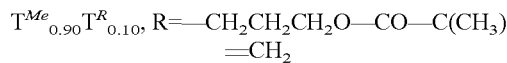
$T^{Me}_{0.90}T^{R}_{0.10}$, R=—CH$_2$CH$_2$CH$_2$O—CO—C(CH$_3$)
=CH$_2$

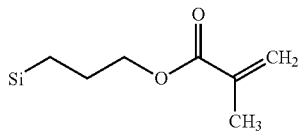

202 g of toluene, 122.60 g of methyltrimethoxysilane (0.9 mol), 24.84 g of (3-methacryloxy)propyltrimethoxysilane (0.10 mol), 350 g of methanol, 71 g of water, 1 g of 0.1 N nitric acid were combined in a flask. The mixture was stirred for 2 hours at room temperature and then refluxed for 2 hours. About 3 mg of 2,6-bis(1,1-dimethylethyl)-4-methylphenol (BHT). After about 350 g of solvent was removed from the Dean-Stark trap, the temperature was raised to 72° C. Subsequently, 150 g of toluene was added to the reactor and the temperature was raised to 86° C. by continuously removing the solvent from the Dean-Stark trap. Once the temperature reached to 86° C., the reaction was stopped. The clear solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 10 wt % with 4-methyl-2-pentanol.

Example 8

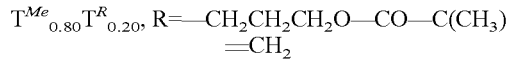
$T^{Me}_{0.80}T^{R}_{0.20}$, R=—CH$_2$CH$_2$CH$_2$O—CO—C(CH$_3$)
=CH$_2$ 150 g of toluene, 109.0 g of methyltrimethoxysilane (0.80 mol), 49.6 g of (3-methacryloxy)propyltrimethoxysilane (0.20 mol), 294 g of methanol, 71 g of water, 1 g of 0.1 N nitric acid were combined in a flask. The mixture was stirred for 2 hours at room temperature and then refluxed for 2 hours. 5 pellets of 2,6-bis(1,1-dimethylethyl)-4-methylphenol (BHT). After about 350 g of solvent was removed from the Dean-Stark trap, the temperature was raised to 72° C. Subsequently, 150 g of toluene was added to the reactor and the temperature was raised to 86° C. by continuously removing the solvent from the Dean-Stark trap. Once the temperature reached to 86° C., the reaction was stopped. The clear solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 10 wt % with 4-methyl-2-pentanol.

Example 9

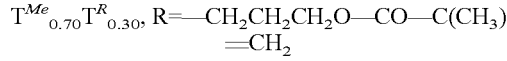
$T^{Me}_{0.70}T^{R}_{0.30}$, R=—CH$_2$CH$_2$CH$_2$O—CO—C(CH$_3$)
=CH$_2$ 150 g of toluene, 95.3 g of methyltrimethoxysilane (0.70 mol), 74.4 g of (3-methacryloxy)propyltrimethoxysilane (0.30 mol), 294 g of methanol, 71 g of water, 1 g of 0.1 N nitric acid were combined in a flask. The mixture was stirred for 2 hours at room temperature and then refluxed for 2 hours. After about 350 g of solvent was removed from the Dean-Stark trap, the temperature was raised to 72° C. Subsequently, 150 g of toluene was added to the reactor and the temperature was raised to 86° C. by continuously removing the solvent from the Dean-Stark trap. Once the temperature reached to 86° C., the reaction was stopped. The clear solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 10 wt % with 4-methyl-2-pentanol.

Example 10

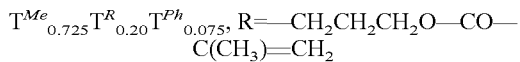
$T^{Me}_{0.725}T^{R}_{0.20}T^{Ph}_{0.075}$, R=—CH$_2$CH$_2$CH$_2$O—CO—C(CH$_3$)=CH$_2$ 150 g of toluene, 98.8 g of methyltrimethoxysilane (0.725 mol), 49.7 g of (3-methacryloxy)propyltrimethoxysilane (0.20 mol), 14.9 g of phenyl trimethoxysilane (0.075 mol), 294 g of methanol, 71 g of water, 1 g of 0.1 N nitric acid were combined in a flask. The mixture was stirred for 2 hours at room temperature and then refluxed for 2 hours. About 3 mg of 2,6-bis(1,1-dimethylethyl)-4-methylphenol (BHT). After about 350 g of solvent was removed from the Dean-Stark trap, the temperature was raised to 70° C. Subsequently, 150 g of toluene was added to the reactor and when the temperature was raised to 73° C., another 150 g of toluene was added to the reactor. The temperature was raised to 92° C. by continuously removing the solvent from the Dean-Stark trap. Once the temperature reached to 92° C., the reaction was stopped. The clear solution was transferred to another flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 10 wt % with 4-methyl-2-pentanol.

Example 11

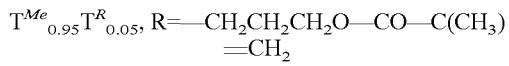
$T^{Me}_{0.95}T^{R}_{0.05}$, R=—CH$_2$CH$_2$CH$_2$O—CO—C(CH$_3$)=CH$_2$ 150 g of toluene, 129.4 g of methyltrimethoxysilane (0.70 mol), 12.4 g of (3-methacryloxy)propyltrimethoxysilane (0.30 mol), 294 g of methanol, 71 g of water, 1 g of 0.1 N nitric acid were combined in a flask. The mixture was stirred for 2 hours at room temperature and then refluxed for 2 hours. 5 pellets of 2,6-bis(1,1-dimethylethyl)-4-methylphenol (BHT). After about 350 g of solvent was removed from the Dean-Stark trap, the temperature was raised to 67° C. Then, 150 g of toluene was added to the reactor and the temperature was raised to 68° C. Then, 150 g of toluene was added to the reactor and the temperature was raised to 70° C. Then, 150 g of toluene was added to the reactor and the temperature was raised to 75° C. by continuously removing the solvent from the Dean-Stark trap. Once the temperature reached to 75° C., the reaction was stopped. The solution of 424 g was transferred to another flask and 42 g of IPA was added to the solution. The solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 10 wt % with 4-methyl-2-pentanol.

Example 12

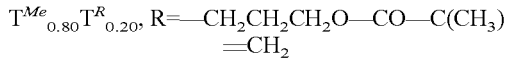
$T^{Me}_{0.80}T^{R}_{0.20}$, R=—CH$_2$CH$_2$CH$_2$O—CO—C(CH$_3$)=CH$_2$ 150 g of toluene, 109.0 g of methyltrimethoxysilane (0.80 mol), 49.7 g of (3-methacryloxy)propyltrimethoxysilane (0.20 mol), 5 pellets of 2,6-bis(1,1-dimethylethyl)-4-methylphenol (BHT), 294 g of methanol, 72 g of water, and 0.46 g of tetramethylammonium hydroxide (TMAH)/methanol solution (0.0005 mol) were combined in a flask. The mixture was stirred for 1 hour at room temperature and then refluxed for 3 hours. Then, 5 g of 0.1 N nitric acid was added to the reactor to neutralize TMAH. The solution was allowed to stir to 5 minutes. Then, 6 g of acetic acid was added to the reactor. After about 350 g of solvent was removed from the Dean-Stark trap, the temperature was raised to 68° C. Subsequently, 160 g of toluene was added to the reactor and the temperature was raised to 70° C. by removing the solvent. Then, 150 g of toluene was added to the reactor and the temperature was raised to 85° C. Then, another 150 g of toluene was added to the reactor and the temperature was raised to 90° C. by continuously removing the solvent from the Dean-Stark trap. Once the temperature reached to 90° C., the reaction was stopped. Once the solution was cooled to below 60° C., 6 g of acetic acid was added to the reactor and the solution was stirred for 10 minutes. The solution was diluted to 867 g with toluene and transferred to a 5 liter separation funnel. The solution was then washed with 250 g of water and the low aqueous phase was discarded. The wash process was repeated twice. Then, the cloudy solution was transferred to a 2 a flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 10 wt % with 4-methyl-2-pentanol.

Example 13

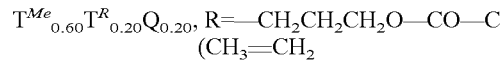
$T^{Me}_{0.60}T^{R}_{0.20}Q_{0.20}$, R=—CH$_2$CH$_2$CH$_2$O—CO—C(CH$_3$)=CH$_2$ 270 g of toluene, 61.3 g of methyltrimethoxysilane (0.45 mol), 37.3 g of (3-methacryloxy)propyltrimethoxysilane (0.15 mol), 31.3 g of tetraethylorthosilicate (0.15 mol), 5 pellets of 2,6-bis(1,1-dimethylethyl)-4-methylphenol (BHT), 362 g of methanol, 54 g of water, and 0.345 g of tetramethylammonium hydroxide (TMAH)/methanol solution (0.000375 mol) were combined in a flask. The mixture was stirred for 1 hour at room temperature and then refluxed for 3 hours. Then, 6 g of acetic acid was added to the reactor to neutralize TMAH. The solution was allowed to stir to 5 minutes. Then, 6 g of acetic acid was added to the reactor. After about 400 g of solvent was removed from the Dean-Stark trap, the temperature was raised to 68° C. Subsequently, 150 g of toluene was added to the reactor and the temperature was raised to 69° C. by removing the solvent. Then, 150 g of toluene was added to the reactor and the temperature was raised to 82° C. Then, another 150 g of toluene was added to the reactor and the temperature was raised to 91° C. by continuously removing the solvent from the Dean-Stark trap. Once the temperature reached to 91° C., the reaction was stopped. Once the solution was cooled to below 60° C., 6 g of acetic acid was added to the reactor and the solution was stirred for 10 minutes. The solution was diluted to 660 g with toluene and transferred to a 5 liter separation funnel. The solution was then washed with 250 g of water and the low aqueous phase was discarded. The wash process was repeated 4 times. Then, the cloudy solution was transferred to a flask and the solvent was removed on a rotary evaporator at 40° C. The colorless viscous liquid was diluted with 4-methyl-2-pentanol to 10 wt %. The residual toluene was continuously removed on the rotary evaporator at 40° C. until the solution was concentrated to about 30 wt %. The solution was again diluted to 10 wt % with 4-methyl-2-pentanol.

Example 14

Formulation for Spin-Coating and UV Cure

To a plastic amber bottle was added 15 g of 4-methyl-2-pentanol, 0.135 g of Irgacure 651 photo initiator, 0.315 g of Irgacure 379 photo initiator. The solution was shaken vigorously until all the initiator dissolves. Then 5 g of a 10 wt % resin solution prepared above was added to the solution and the mixture was evenly mixed. Film coating on wafers was processed on a Karl Suss CT62 spin coater. The formulated resin solution was first filtered through a 0.20 µm PTFE membrane filter and then spin coated onto standard single side four inch polished low resistively wafers or double sided polished FTIR wafers (spin speed 2000-4000 rpm). Films were prebaked at 140° C. for a minute and then cured via a UV source at a dosage of 10 J/cm². The film thicknesses were measured using a J. A. Woollam ellipsometer.

Example 15

Formulation for Spin-Coating and Thermal Cure

To a plastic bottle was added 1 g of 4-methyl-2-pentanol and 0.025 g of benzoyl peroxide. The solution was shaken vigorously until benzoyl peroxide was dissolved. Then 4.5 g of 10 wt % resin solution prepared above and 12 g of 4-methyl-2-pentanol was added to dilute the solution. Film coating on wafers was processed on a Karl Suss CT62 spin coater. The formulated resin solution was first filtered through a 0.20 µm PTFE membrane filter and then spin coated onto standard single side four inch polished low resistively wafers or double sided polished FTIR wafers (spin speed 2000-4000 rpm). Films were prebaked and cured at 140° C. for three minute. The film thicknesses were measured using a J. A. Woollam ellipsometer.

What is claimed is:

1. A method for forming a reverse pattern on a substrate wherein the method comprises
   (I) applying a coating composition over a first patterned material wherein the coating composition comprises
   (i) a silsesquioxane resin comprised of the units $(MeSiO_{(3-x)/2}(OR')_x)_m$ $(RSiO_{(3-x)/2}(OR')_x)_n$ $(R^1SiO_{(3-x)/2}(OR')_x)_o$ $(SiO_{(4-x)/2}(OR')_x)_p$ $(Ph(CH_2)_sSiO_{(3-x)/2}(OR')_x)_q$ where Ph is a phenyl group, Me is a methyl group; R' is hydrogen atom or a hydrocarbon group having from 1 to 4 carbon atoms; R is a reactive organic group selected from groups containing epoxy functionality and groups containing acryloxy functionality, $R^1$ is a hydrophilic group; and s has a value of 0, 1, 2, 3, or 4; x has a value of 0, 1 or 2; and in the resin m has a value of 0.2 to 0.95, n has a value of 0.01 to 0.5; o has a value of 0 to 0.20; p has a value of 0 to 0.75; q has a value of 0 to 0.5 and m+n+o+p+q≈1; and
   (ii) a solvent for carrying the resin without dissolving the first patterned material; and
   (iii) an activator;
   (III) curing the coating composition to produce a cured silicon coating on top of the first patterned material covering the entire pattern;
   (IV) partially removing the cured silicon coating to expose the top surface of the first patterned material;
   (V) removing the first patterned material thereby forming a second patterned in the cured silicon coating; and
   (VI) optionally, further transferring the second pattern onto any underlayer;
   wherein the first patterned material is formed by a method consisting of applying a photoresist to the substrate and patterning the applied photoresist to form the first patterned material.

2. The method as claimed in claim 1 where m has a value of 0.5 to 0.90, n has a value of 0.05 to 0.30; o has a value of 0 to 0.20; p has a value of 0 to 0.30; and q has a value of 0 to 0.15.

3. The method as claimed in claim 1 wherein R is an epoxy group having the formula —$R^2OCH_2CH(O)CH_2$, where $R^2$ is hydrocarbon group having 1 to 4 carbon atoms or a polyether group or —$CH_2CH_2$—$(C_6H_9(O))$.

4. The method as claimed in claim 3 wherein the activator is selected from a thermal acid generator, a photoacid generator or an amine crosslinker.

TABLE 2

Resin Stability and Cured Thin Film Solvent Resistance

| | | | UV Cure | | Thermal Cure | |
| --- | --- | --- | --- | --- | --- | --- |
| Material | $M_w$ vs. PS | $M_w/M_n$ vs. PS | Thin Film Thickness After Cured (Å) | Thickness Change in PGMEA (Å) | Thin Film Thickness After Cured (Å) | Thickness Change in PGMEA (Å) |
| Example 10 | 3500 | 2.27 | 1144 | 54 | 1031 | 196 |
| Example 7 | 24100 | 15.4 | 1194 | 116 | 988 | 626 |
| Example 12 | 23300 | 6.15 | 1434 | 63 | 1249 | 20 |

5. The method as claimed in claim 1 wherein R is 3-glycidoxypropyl group.

6. The method as claimed in claim 1 wherein R is a 2-(3,4-epoxycyclohexyl) group.

7. The method as claimed in claim 1 wherein R is an acryloxy functionality having the formula $CH_2=C(R^3)COOR^4$—, where $R^3$ is hydrogen atom or a methyl group and $R^4$ is hydrocarbon group having 1 to 4 carbon atoms or a polyether group.

8. The method as claimed in claim 7 wherein the activator is selected from a free radical thermal initiator or a photo radical initiator.

9. The method as claimed in claim 1 wherein R is a methacryloxypropyl group.

10. The method as claimed in claim 1 wherein R is an acryloxypropy group.

11. The method as claimed in claim 1 wherein $R^1$ is selected from substituted phenyl groups, ester groups, polyether groups, and mercapto groups.

12. The method as claimed in claim 11 wherein the solvent is selected from -methoxy-2-propanol, 4-methyl-2-pentanol, propylene glycol monomethyl ethyl acetate, γ-butyrolactone, and cyclohexanone.

13. The method as claimed in claim 1 wherein the coating composition is thermally cured by heating at 80° C. to 450° C. for 0.1 to 60 minutes.

14. The method as claimed in claim 1 wherein the coating composition is radiation cured by exposing the coating composition to a radiation source selected from UV, X-ray, e-beam, or EUV.

15. The method as claimed in claim 1 wherein the cured silicon coating composition is partially removed using a reactive ion etch containing $CF_4$.

16. The method as claimed in claim 1 wherein the first patterned material is removed by a reactive ion etch containing $O_2$.

* * * * *